United States Patent [19]
Khan et al.

[11] Patent Number: 5,250,444
[45] Date of Patent: Oct. 5, 1993

[54] RAPID PLASMA HYDRDOGENATION PROCESS FOR POLYSILICON MOSFETS

[75] Inventors: Babar Khan, Ossining; Barbara A. Rossi, Putnam Valley, both of N.Y.; Uday Mitra, San Jose, Calif.

[73] Assignee: North American Philips Corporation, New York, N.Y.

[21] Appl. No.: 842,854

[22] Filed: Feb. 21, 1992

[51] Int. Cl.$^5$ .................... H01L 21/324
[52] U.S. Cl. .................... 437/24; 437/937; 437/247; 148/DIG. 128
[58] Field of Search .......... 437/21, 24, 25, 41, 437/247, 248, 937; 148/DIG. 125, DIG. 128, DIG. 157

[56] References Cited

U.S. PATENT DOCUMENTS

| | | | |
|---|---|---|---|
| 4,113,514 | 9/1978 | Pankove et al. | 437/248 |
| 4,315,782 | 2/1982 | Tarng | 437/937 |
| 4,331,486 | 5/1982 | Chenevas-Paule et al. | 437/937 |
| 4,605,447 | 8/1986 | Brotherton et al. | 437/937 |
| 4,943,837 | 7/1990 | Konishi et al. | 437/937 |
| 5,112,764 | 5/1992 | Mitra et al. | 437/41 |

FOREIGN PATENT DOCUMENTS 1-45172 2/1989 Japan.

OTHER PUBLICATIONS

Campbell et al, Enhanced Conductivity in Plasma-Hydrogenated Polysilicon Films, Appl. Phys. Lett., 36, (7) pp. 604-606, Apr. (1980).
Hasegawa et al, Plasma-Hydrogenation Effects on Conductivity and Electron Spin Resonance in Undoped ..., J. Appl. Phys., 53 (7) pp. 5022-5026, Jul. (1982).
Kamins, Electrical Properties of Polycrystalline-Silicon Thin Films, Proceedings of the Fifth ..., 1986, pp. 235-249, (1986).
Nazakawa et al, Mechanism of a Hydrogenating Polycrystalline Silicon in Hydrogen Plasma Annealing, Appl. Plys., Lett., 51 (20) pp. 1623-1625, Nov. (1987).
Rodder et al, Utilization of Plasma Hydrogenation in Stacked SRAM's with Poly-Si PMOSFET's and ..., IEEE Electron Device Letters, vol. 12, No. 5, pp. 233-235, May, 1991.
Wu et al, Passivation Kinetics of Two Types of Defects in Polysilicon TFT ... IEEE Electron Device Letters, vol. 12, No. 4, pp. 181-183, Apr. 1991.
Mitra et al, Mechanism of Plasma Hydrogenation of Polysilicon ... J. of the Electrochemical Society, vol. 138, No. 11, pp. 3420-3424, Nov. 1991.

Primary Examiner—Brian E. Hearn
Assistant Examiner—C. Chaudhari
Attorney, Agent, or Firm—Ernestine C. Bartlett

[57] ABSTRACT

A method for rapid plasma hydrogenation of semiconductor devices is provided in which the hydrogenation is conducted in two steps, the first step being conducted at a hydrogenation temperature that is higher than the out-diffusion temperature at which a substantial amount of hydrogen diffuses out of said semiconductor device; and in the second step, the semiconductor device is cooled to a temperature at which out-diffusion is substantially avoided while the hydrogenation plasma is maintained.

9 Claims, 23 Drawing Sheets

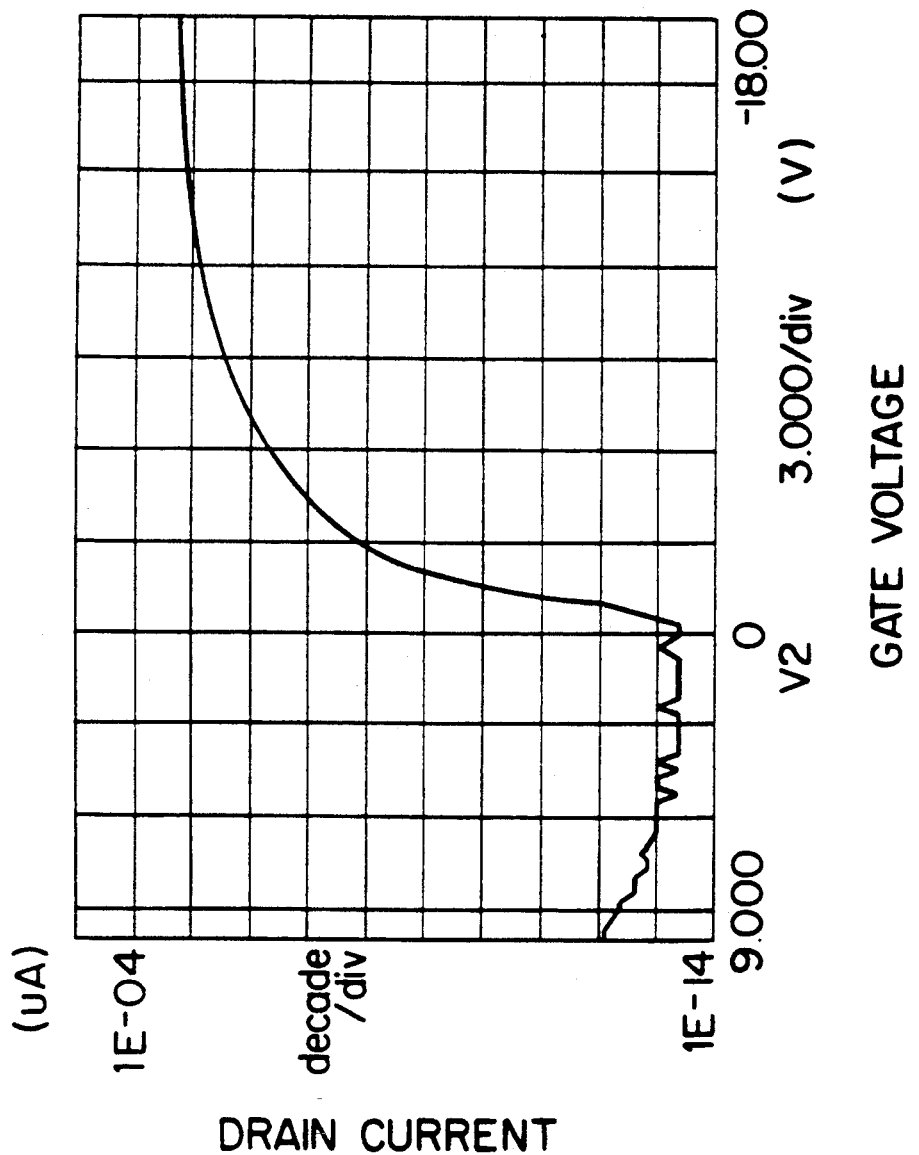

RAPID PLASMA HYDRDOGENATION PROCESS FOR POLYSILICON MOSFETS

BACKGROUND OF THE INVENTION

This invention relates to a semiconductor device and a method of manufacturing a semiconductor device in which a structure is formed on a major surface of a semiconductor body and includes an insulating layer at said major surface, and in which a plasma and heating treatment is performed to passivate polysilicon grain boundaries and interface traps. Such methods are particularly important for the manufacture of devices such as charge-transfer devices and insulated gate field-effect transistor circuits in which electrodes are formed on the insulating layer and serve to control the passage of charge carriers in the underlying portion of the body by capacitance coupling across the insulating layer.

Liquid crystal display devices are now widely used. The performance of such display devices is influenced by the characteristics of thin film transistor ("TFT") components making up the display. It is known that the characteristics of the TFT may be greatly improved by the hydrogenation of polycrystalline silicon which is used to make the TFT. Plasma hydrogenation is the critical fabrication step in fabricating high performance polysilicon MOSFETs or TFTs. Such devices as shown in FIG. 1 are treated by plasma hydrogenation to improve device characteristics as illustrated in FIG. 2. However, normal plasma hydrogenation is a slow process which adds to the expense of and generates greater inefficiency in the manufacturing process. For example, typically the hydrogenation time is inversely proportional to the hydrogenation temperature, i.e. the higher the temperature at which hydrogenation is conducted, the shorter the hydrogenation time. However, this time temperature relationship can only be utilized to a limited extent because at a certain elevated temperature the device starts to lose hydrogen through out-diffusion and the performance characteristics of the device are degraded. As a result, the process has been limited to temperatures below the out-diffusion temperature and this leads to long hydrogenation times.

SUMMARY OF THE INVENTION

An object of this invention is to provide (1) a semiconductor device, for example a TFT, whose characteristics can be improved by hydrogenation and (2) a method of fabricating such a TFT in which the hydrogenation time is substantially shortened.

Another object of the invention is to provide a process for the manufacture of polysilicon MOSFETs in which the hydrogenation time is substantially shortened and the efficiency of the manufacturing process is markedly improved.

These and other objects are attained according to the present invention by a method of manufacturing a semiconductor device comprising the steps of (a) providing a semiconductor body capable of undergoing hydrogen in-diffusion and hydrogen out-diffusion at selected temperatures;

(b) subjecting said semiconductor body to plasma hydrogenation to effect in-diffusion of atomic hydrogen, said in-diffusion being effected at a hydrogenation temperature that is higher than the out-diffusion temperature at which a substantial amount of hydrogen diffuses from said semiconductor body;

(c) preferably, maintaining said plasma hydrogenation at said hydrogenation temperature for a period of time sufficient to stabilize, and preferably to obtain substantial equilibrium of, said hydrogen in-diffusion relative to said out-diffusion from said semiconductor body, and (d) subjecting said semiconductor body to said hydrogenation plasma while said semiconductor body is cooled to a temperature at which out-diffusion is substantially avoided.

More specifically, we have found a new method for plasma hydrogenation that consists of two steps (referred to as the "Hi/Lo Process") and by which the process time may be substantially shortened when compared to the conventional continuous process. In its specific embodiments, employing the equipment presently available, in the first step for example, the plasma hydrogenation may be effected at a temperature within the range of 400° C. to 800° C., preferably at temperatures of about 435° C. or higher for a period of about 30 minutes or less depending on the temperature. Thereafter, the semiconductor body, while still in the presence of the hydrogen plasma may be permitted to cool or is cooled to a temperature within the range of about 25° C. to 375° C. over a period of time that may vary as desired but is preferably 30 minutes or less.

It has been found that the high temperature step increases the diffusion of atomic hydrogen into the polysilicon and leads to rapid hydrogenation of the device. There is no dehydrogenation due to the presence of the hydrogen plasma. During the second step with the hydrogen plasma still on, the temperature is lowered or cools to a level (for example, to 325° C.) at which no dehydrogenation can occur even after the hydrogen plasma is shut off or removed. It has been found that dehydrogenation starts at some point between about 350° C. and about 375° C. in both nitrogen and hydrogen ambients degrading device performance.

BRIEF DESCRIPTION OF THE DRAWINGS

FIGS. 10(a) and 10(b) are graphs showing the drain current versus gate voltage for a device comprising a back light shield and hydrogenated with the two-step process of the invention;

DETAILED DESCRIPTION OF THE PREFERRED EMBODIMENTS

Figure 1:
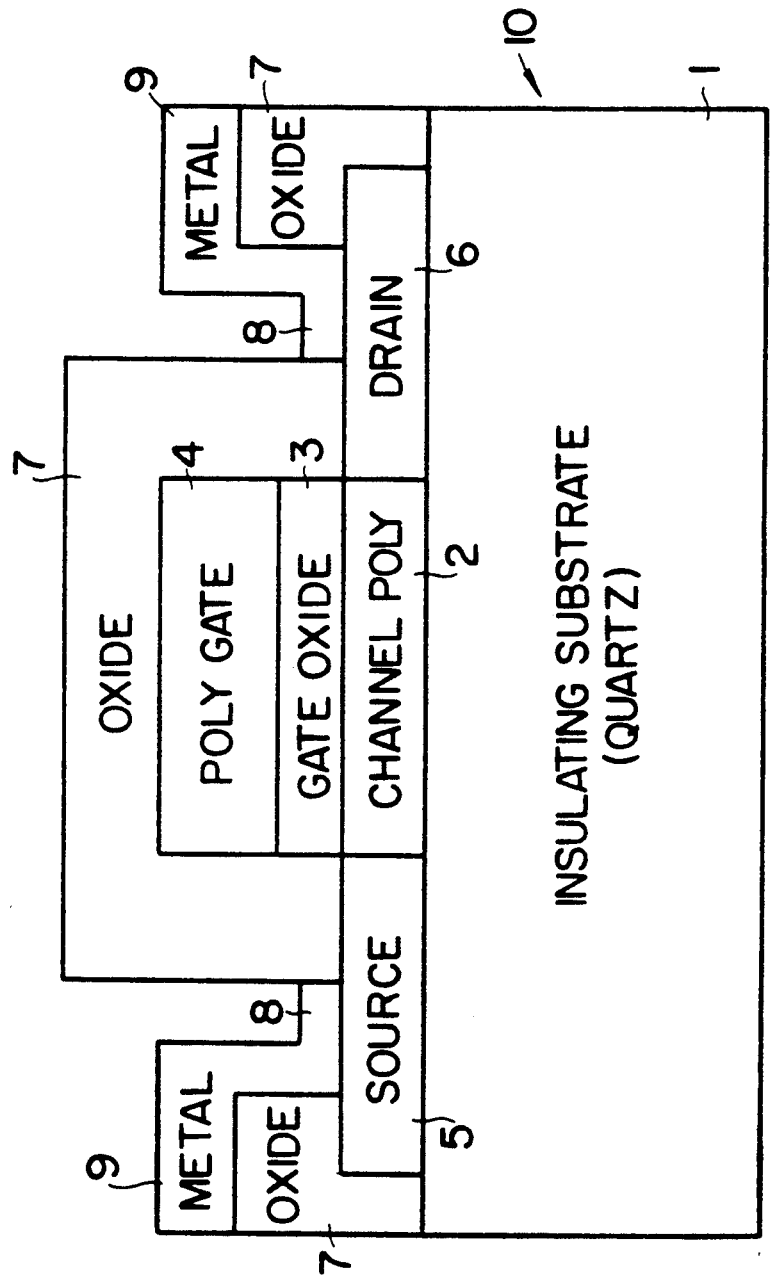
FIG. 1 is a diagrammatical, sectional view showing a TFT of the invention.

With reference to the drawings, in FIG. 1, there is illustrated according to the invention a polysilicon MOSFET or TFT 10 provided by methods well known in the art.

Figure 2:
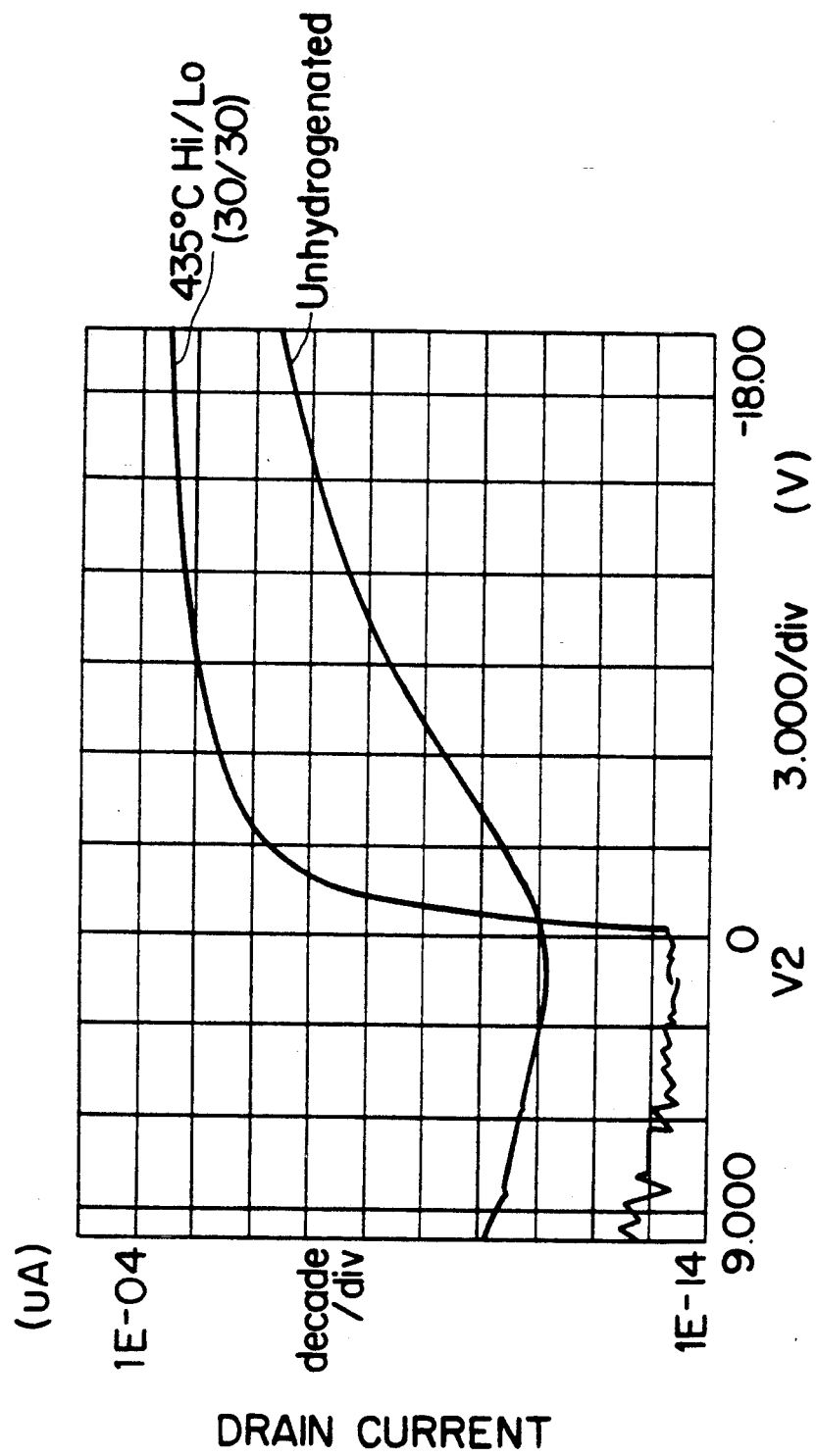
FIG. 2 is a graph showing the drain current (in log scale) vs. gate voltage of an unhydrogenated and hydrogenated polysilicon TFT.

Polysilicon TFTs were fabricated on a quartz substrate 1. The basic steps for fabricating the TFTs were (1) deposition and patterning of the channel polysilicon 2; (2) gate oxidation of the polysilicon at 1050° C. in dry oxygen to form the gate oxide 3; (3) deposition and doping of 5000 Å polysilicon for the polygate 4, followed by patterning of this layer; (4) ion implantation of the source 5 and drain 6 regions to form self-aligned gates, (5) deposition and densification of CVD oxide to form the crossover dielectric 7, (6) opening of the contact holes 8 to the source and drain; and (7) deposition and patterning of metal, for example aluminum 9 for interconnection to the source and drain. FIG. 1 shows a cross section of the TFT. After fabrication, the TFTs were subjected to a hydrogen plasma. FIG. 2 illustrates the improved characteristics of a device processed according to the invention when compared to an unhydrogenated device. Most of the hydrogenations discussed herein were conducted in a parallel plate reactor commercially available as Plasma Therm PT-73 although any suitable plasma system may be used. Most, if not all, of the hydrogenations described herein to determine the mechanism of the hydrogenation were conducted in a Plasma Therm 730.

As discussed hereinabove, in order to circumvent the problem of the lengthy prior art process, we have invented a new method for plasma hydrogenation. This new process consists of 2 steps. In the first step, the plasma hydrogenation is done at a high temperature 400° C., (preferably 435° C. or higher). In the second step, the temperature is lowered from the high temperature to a lower temperature (preferably to 325° C.) without shutting off the hydrogen plasma.

The high temperature step increases the diffusion of the hydrogen into the polysilicon 2 and leads to rapid hydrogenation of the entire device. There is no dehydrogenation due to the presence of the hydrogen plasma. During the second step with the hydrogen plasma still on, the temperature is lowered to a level (for example to 325° C.) at which no dehydrogenation can occur even after the hydrogen plasma is shut off.

This 2-step Hi/Lo process was run in a Plasma Therm PT-73 parallel plate reactor using the following parameters:

500 watts@13.56 MHz
110 mTorr of pressure
45 sccm hydrogen
435° C. for 30 minutes followed by 30 minutes at 435° C. cooled to 325° C.
Total time=60 minutes This process is compared with the single step (one temperature) continuous process with all process parameters identical other than temperature. The parameters of the invention were tested in a series of experiments in which a semiconductor device having the structure illustrated in FIG. 1 was produced, hydrogenated as indicated, and its characteristics tested and plotted as illustrated in the figures.

Hydrogenation experiments were performed with both P and N channel TFTs. For the sake of consistency only p-channel devices were used for most of the results reported below. However experiments with n-channel devices showed that their behavior is similar. Additionally, as suitable plasma, instead of pure hydrogen, mixtures of hydrogen in nitrogen and/or argon may also be employed.

Figure 3:
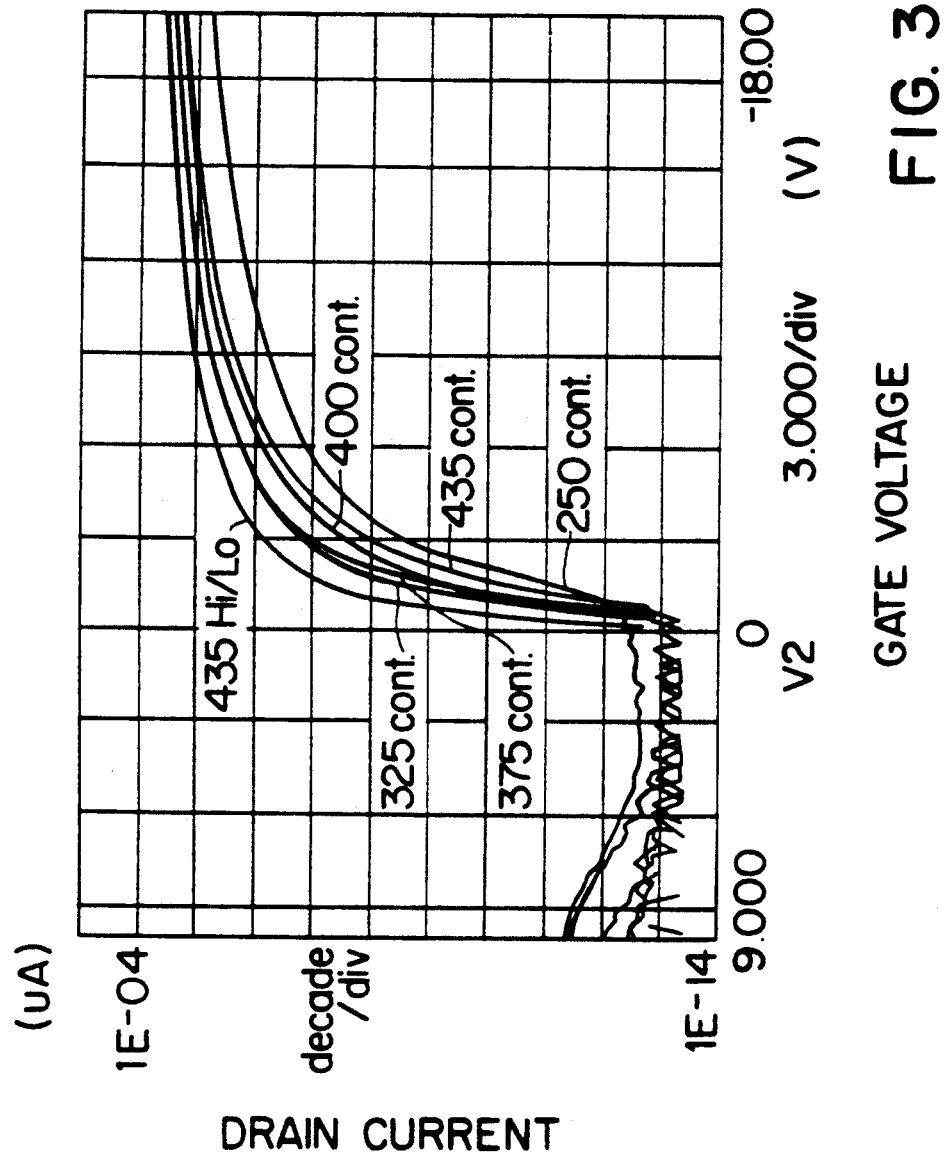
FIG. 3 is a graph showing a variation of drain current for a TFT obtained by two-step process of the invention compared to a TFT obtained by a single step process at different temperatures.
Figure 4:
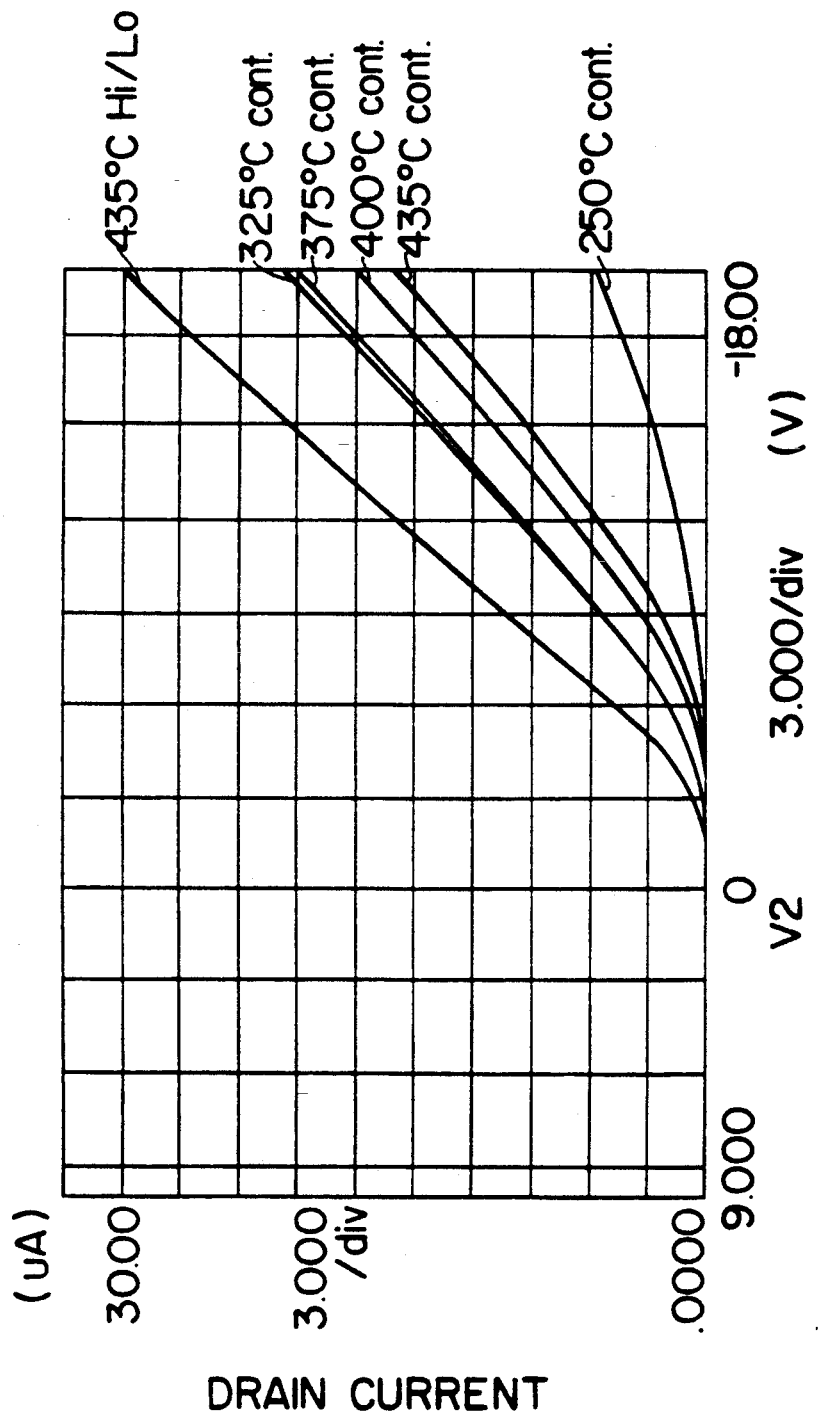
FIG. 4 is a graph showing the same device as in FIG. 3 except that the variation in drain current is in linear scale.

For the experiments illustrated in the figures, in the experiments illustrated in FIGS. 3 and 4, TFT devices were hydrogenated in a 2-step hydrogenation process (435° C. Hi/Lo, 30 minutes at 435° C. followed by 30 minutes with temperature lowered from 435° C. to 325° C.) versus different continuous single step hydrogenation processes done at different temperatures (250° C., 325° C., 375° C., 40° C., and 435° C.). Total hydrogenation time in all cases was 60 minutes. It will be seen that the 2-step hydrogenation process results in superior device characteristics when compared to any of the single step hydrogenation processes.

Figure 5:
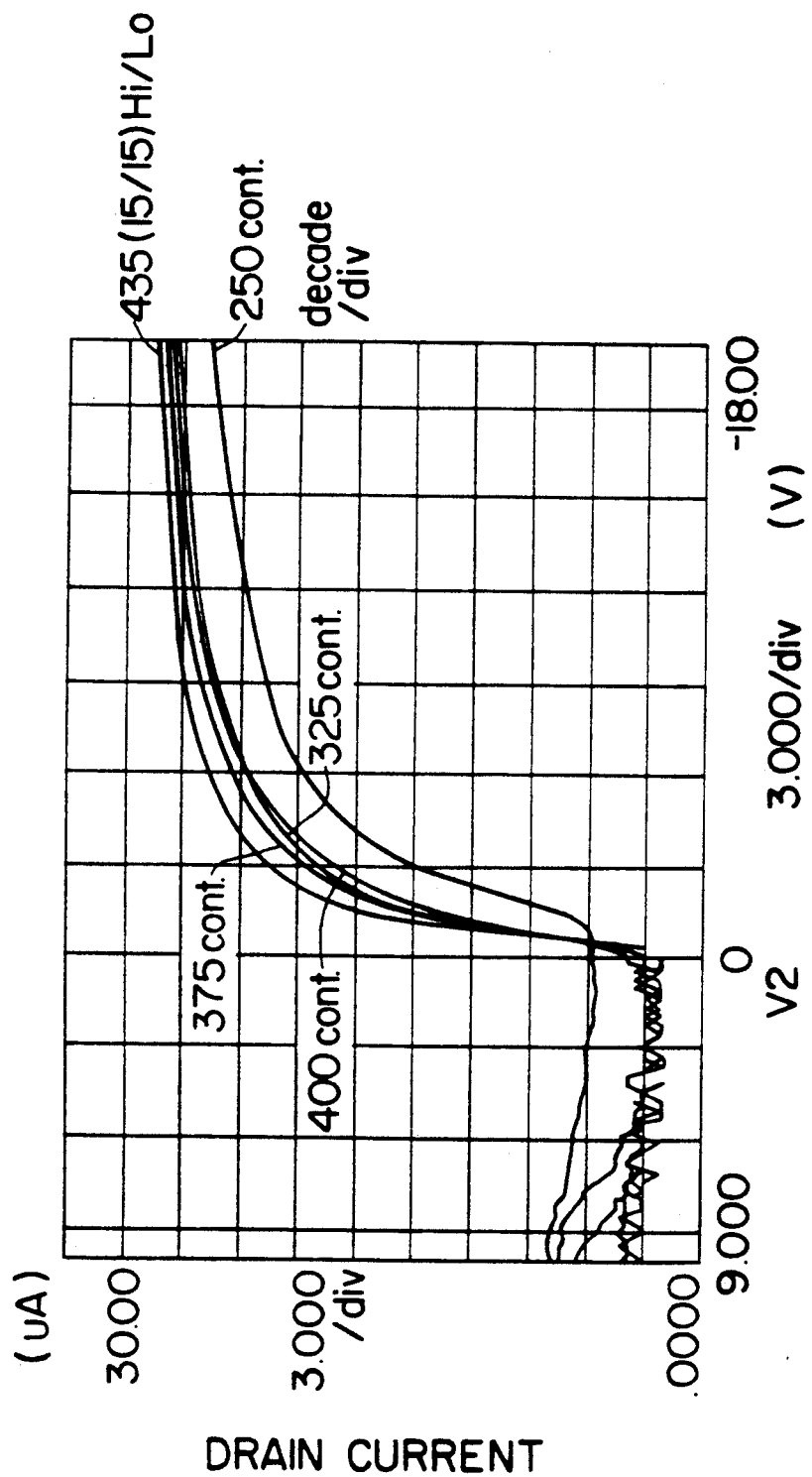
FIG. 5 is another graph showing a variation of drain current for a TFT obtained by the two-step process of the invention compared to a TFT obtained by a single step process at different temperatures.
Figure 6:
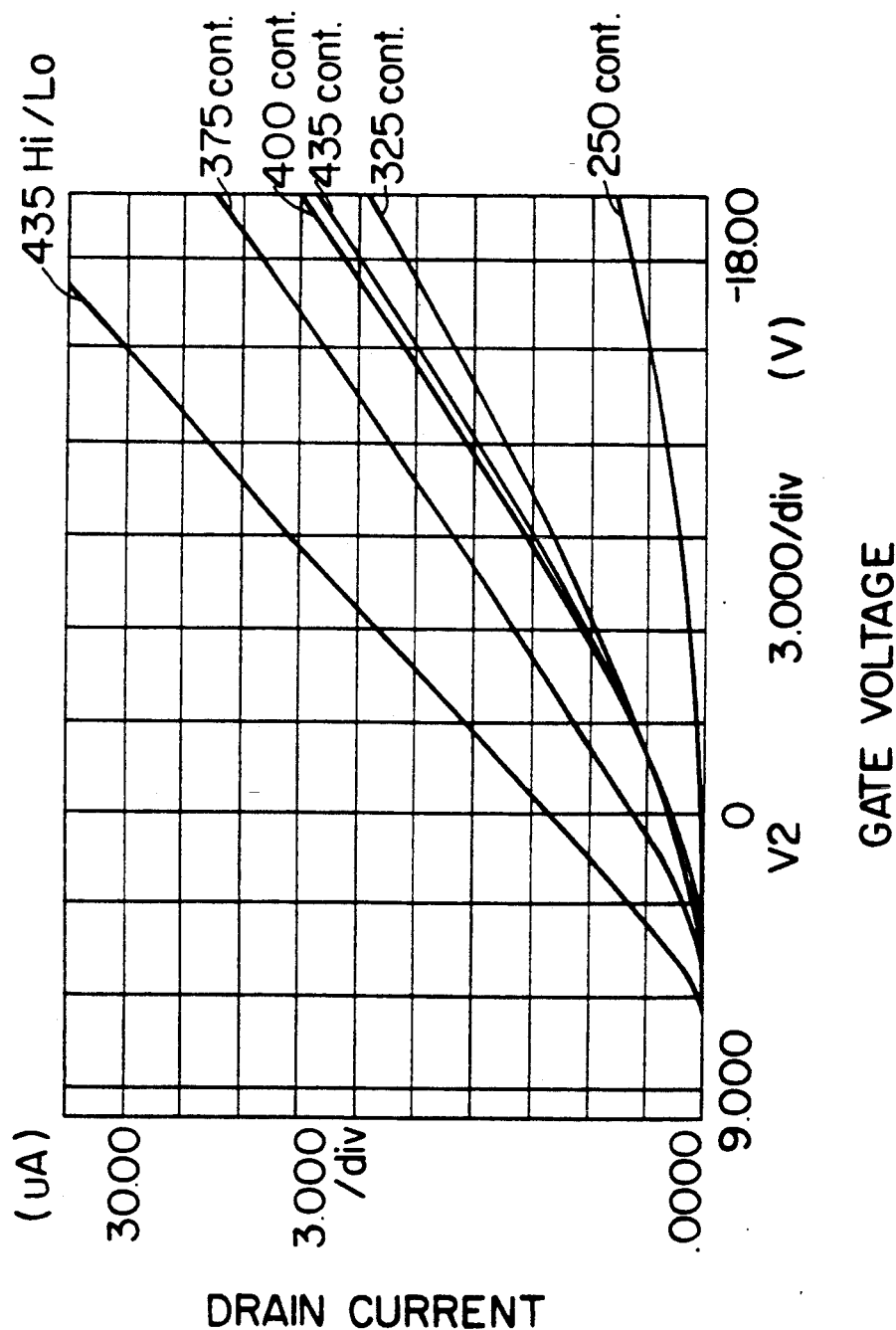
FIG. 6 illustrates the same device as in FIG. 5 except that the variation in drain current is in linear scale.

In FIGS. 5 and 6, TFT devices were hydrogenated in the 2-step hydrogenation process (435° C. Hi/Lo, 15 minutes at 435° C. to 325° C.) versus different single step, (continuous) hydrogenation processes done at different temperatures (250° C., 325° C., 375° C., 400° C., and 435° C.). Total hydrogenation time in all cases was 30 minutes. It will be seen that the 2-step hydrogenation process results in superior device characteristics when compared to any of the single step hydrogenation processes.

Figure 7:
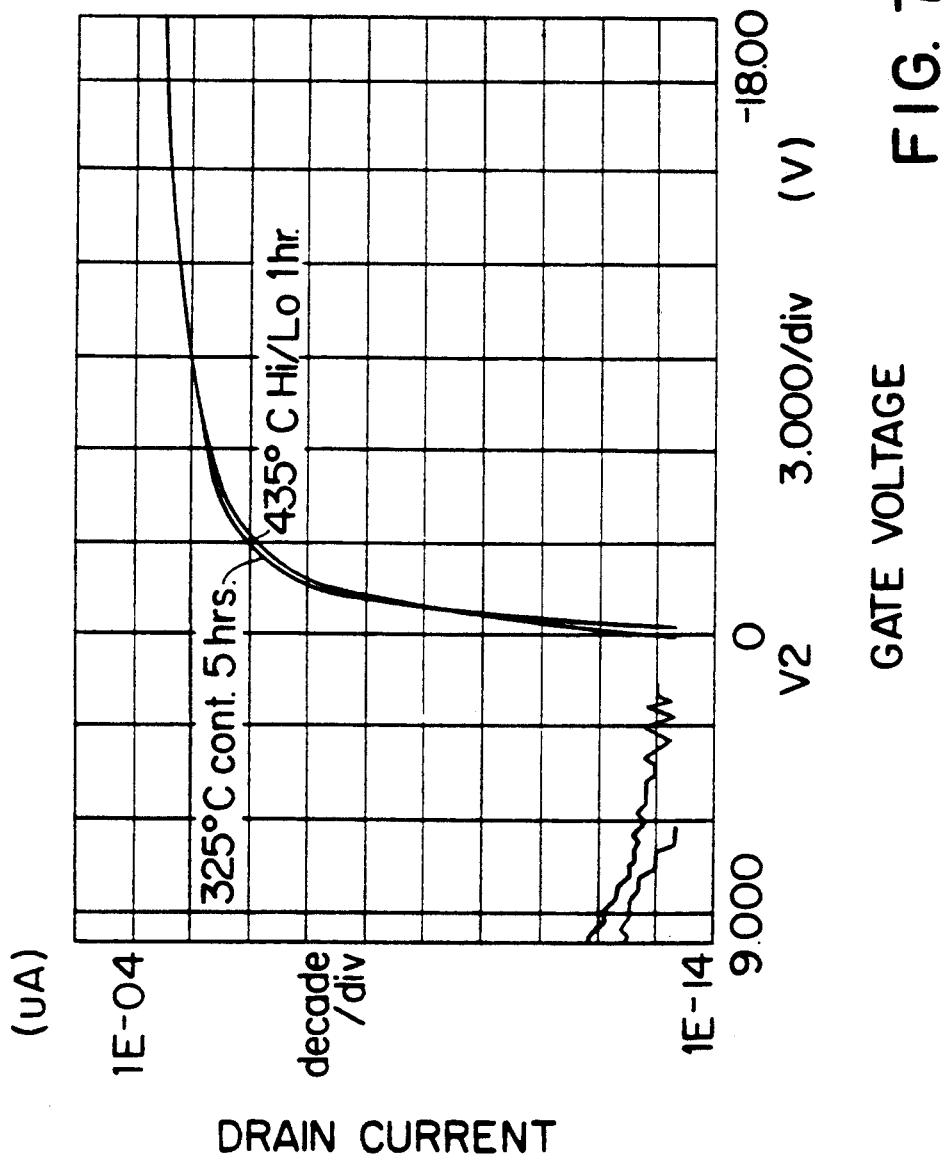
FIG. 7 is another graph showing a variation of drain current versus gate voltage for a device hydrogenated with the two-step process of the invention compared to a TFT obtained by a single step process.

In FIG. 7, a device was hydrogenated with the 2-step hydrogenation process (435° C. Hi/Lo, total time=60 minutes) and compared with a single step hydrogenation process (325° C. cont., 5 hours). This shows that the shorter time 2-step hydrogenation process produces devices with characteristics that are equivalent to those devices produced by the long hydrogenation time with the single step process.

Figure 8:
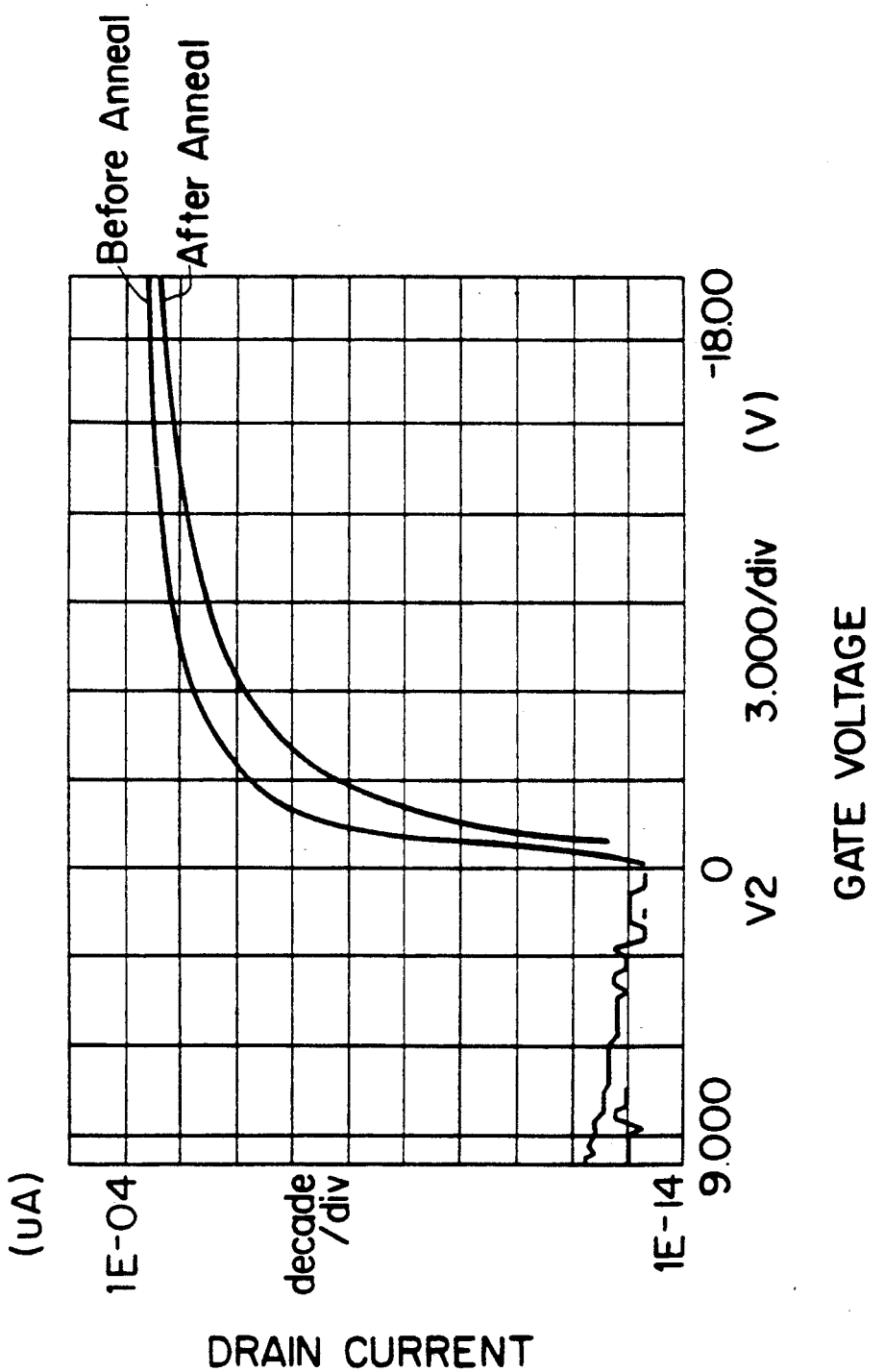
FIG. 8 is another graph showing a variation in the drain current versus gate voltage for a device hydrogenated with the two step process of the invention and the same device after an anneal in a nitrogen atmosphere.

In FIG. 8, a device was hydrogenated with the 2-step hydrogenation process (435° C. Hi/Lo, 60 minutes) and the same device measured after $N_2$ anneal at 435° C. for 15 minutes. In this step, the plasma is shut off and the device is allowed to sit in the reactor for the designated period of time at the indicated temperature. It will be seen that the nitrogen anneal results in a loss of hydrogen and degrades the device.

From the experimental results illustrated in FIGS. 3 to 6, it can be clearly seen that for a fixed hydrogenation time, decidedly better results are obtained with the 2-step hydrogenation process of the invention.

The results illustrated in FIG. 7 show that a short (60 minute) 2-step hydrogenation process of the invention produces devices with characteristics that are equivalent to devices produced by a long hydrogenation time (5 hours) with the single step, continuous process conducted at 325° C.

Figure 9:
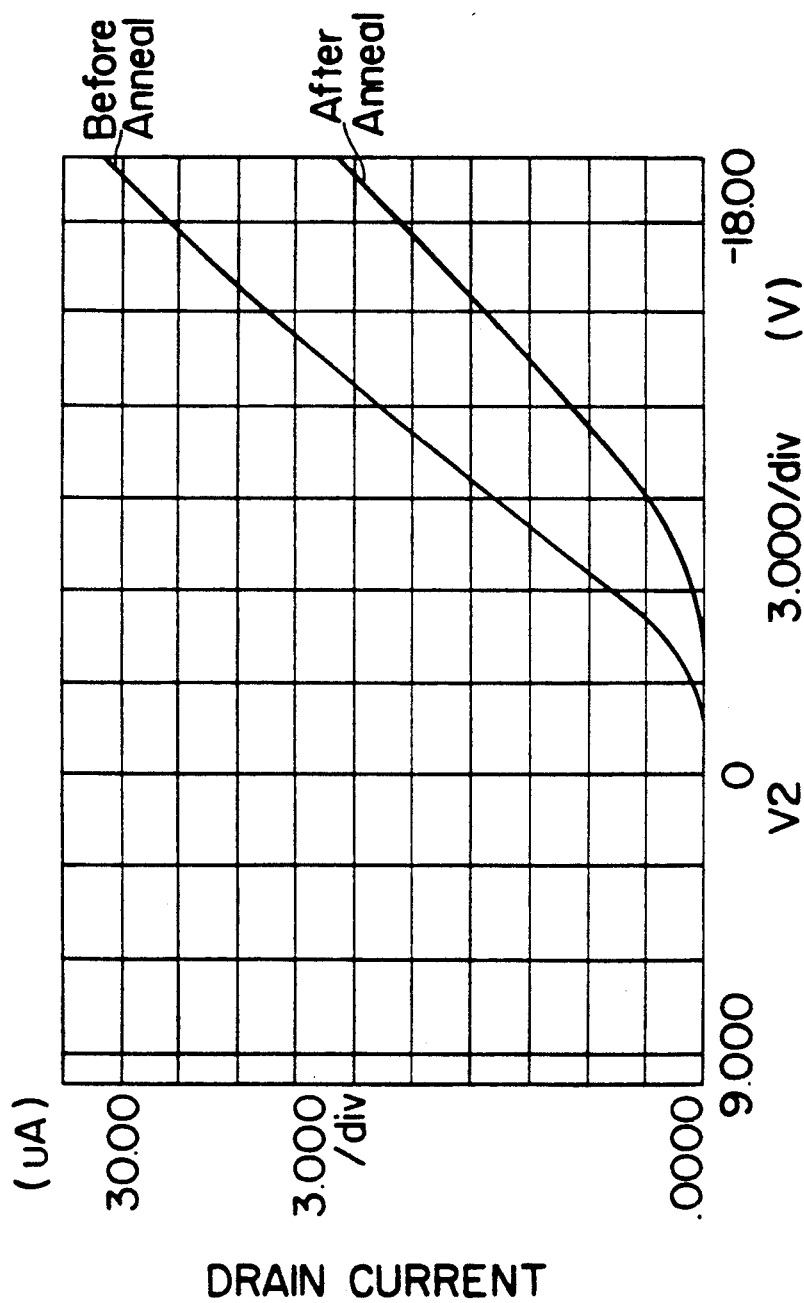
FIG. 9 shows the same device as illustrated in FIG. 8 except that this variation in drain current is in linear scale.

The results illustrated in FIGS. 8 and 9 show that the devices are degraded due to the loss of hydrogen on anneal at 435° C. in a nitrogen ambient. This shows that the second step of the 2-step hydrogenation process (temperature lowered, hydrogen plasma still on) is needed to prevent dehydrogenation.

To fully evaluate the mechanism and kinetics of the two-step plasma hydrogenation process of the invention, several experiments were conducted as a continuous process and the results plotted and presented in the Figures.

Effect of Hydrogenation Time

Figure 12:
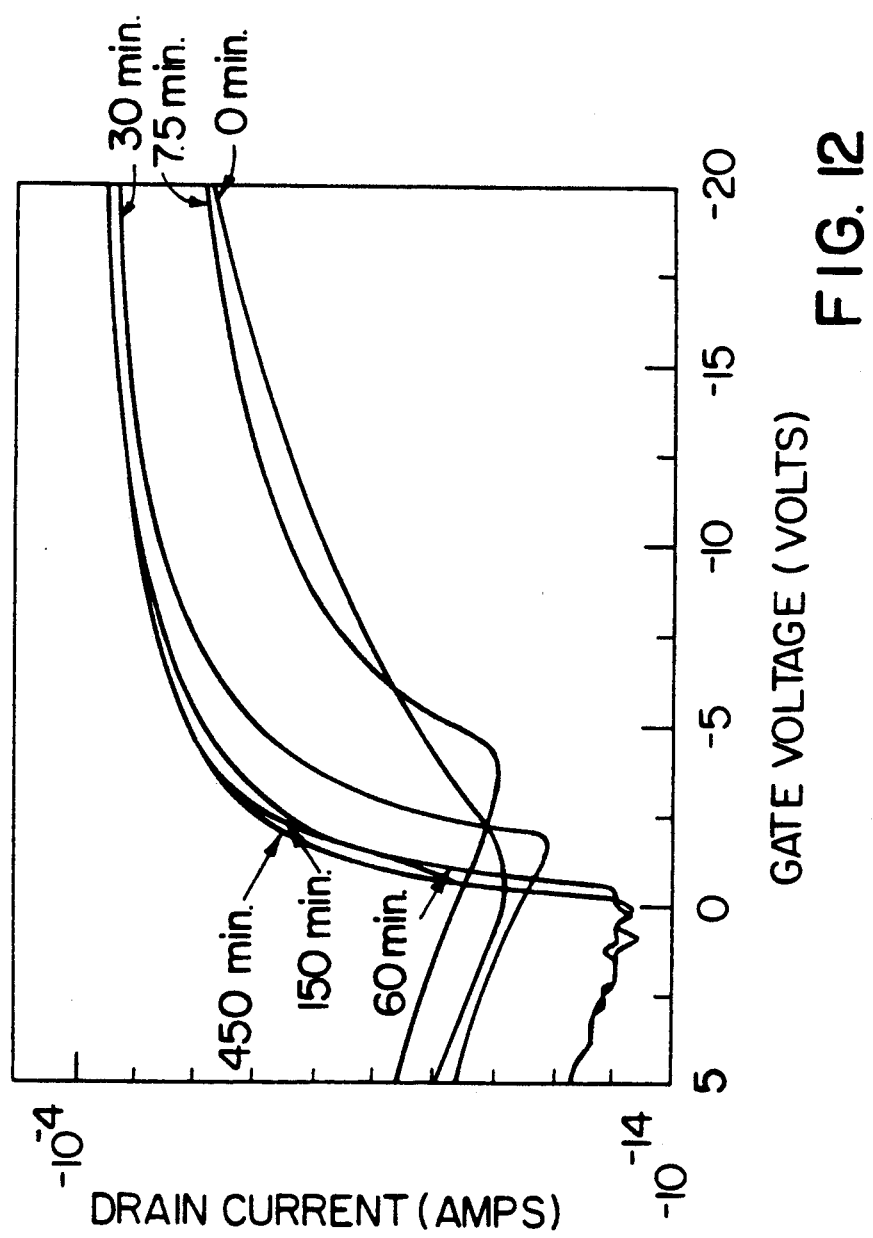
FIG. 12 is a graph illustrating the effect of hydrogenation time in a continuous process on device characteristics of 32 μm/32 μm TFTs with 500 Å channel polysilicon.

FIG. 12 is a plot of the variation of the drain current with gate voltage for 32 μm/32 μm devices with 500 Å channel polysilicon which were hydrogenated for various times at constant power, pressure, temperature, gas flow and frequency. These devices were tested at a drain voltage of −5 V and were hydrogenated at a continuous temperature of 275° C., at a power setting of 500W, flow of 150 sccm hydrogen at 13.5 MHz and 100 m Torr. The data indicates that the device characteristics ("off" current, subthreshold slope and "on" current) rapidly improve during the first 60 minutes of hydrogenation time, after which there is little further improvement. Experiments were also done to see if annealing in molecular hydrogen (no plasma) at 275° C. had any effect. In the absence of a plasma there was no effect on the device characteristics, indicating that active hydrogen atoms were needed to passivate the polysilicon.

Effect of Polysilicon thickness

Figure 13:
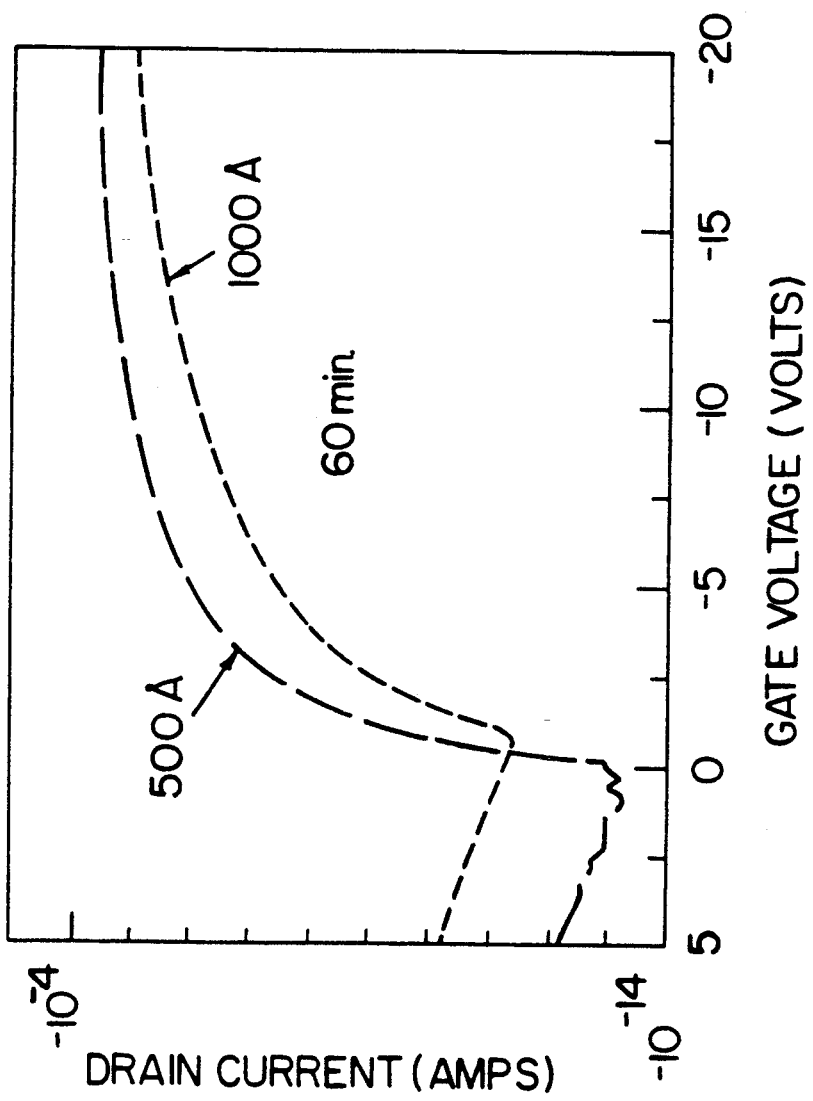
FIG. 13 is a comparison of device characteristics for TFTs with 500 Å and 1000 Å polysilicon after 1 hour of plasma hydrogenation in a continuous process.
Figure 14:
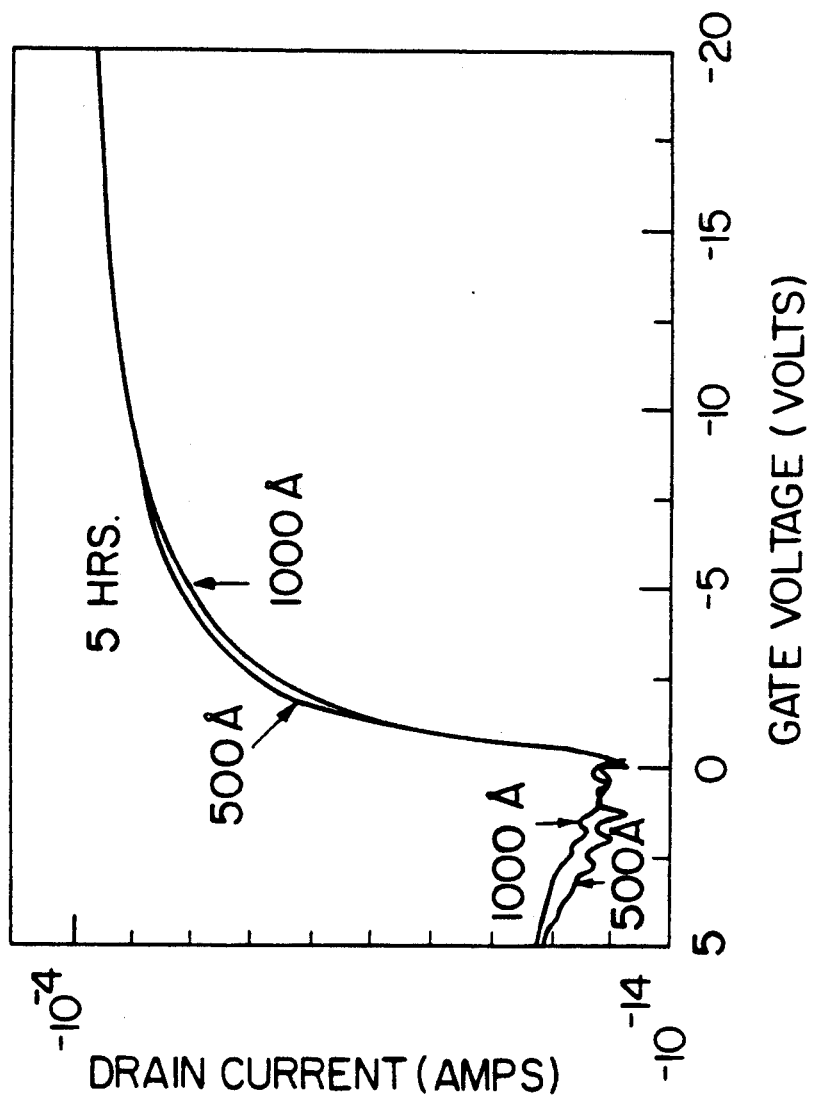
FIG. 14 is a comparison of the device characteristics of the device of FIG. 13 for TFTs with 500 Å and 1000 Å polysilicon after 5 hours of continuous plasma hydrogenation.

Experiments were performed using TFTs with 500 Å thick channel polysilicon (after fabrication) as well as those with 1000 Å polysilicon. Process conditions were the same as that given for FIG. 12. FIG. 13 is a plot of the variation of the drain current versus gate voltage for devices with 500 Å and 1000 Å channel polysilicon which were hydrogenated for 1 hour. The characteristics of the 500 Å thick polysilicon TFT appears to be much better than that with 1000 Å polysilicon. FIG. 14 shows the results after 5 hours of hydrogenation. Here the characteristics of the TFTs with 500 Å and 1000 Å thick polysilicon are comparable. Therefore, from FIGS. 13 and 14 it can be seen that TFTs with thinner polysilicon channels hydrogenate faster than those with thicker polysilicon.

Effect of Device Size

Figure 15:
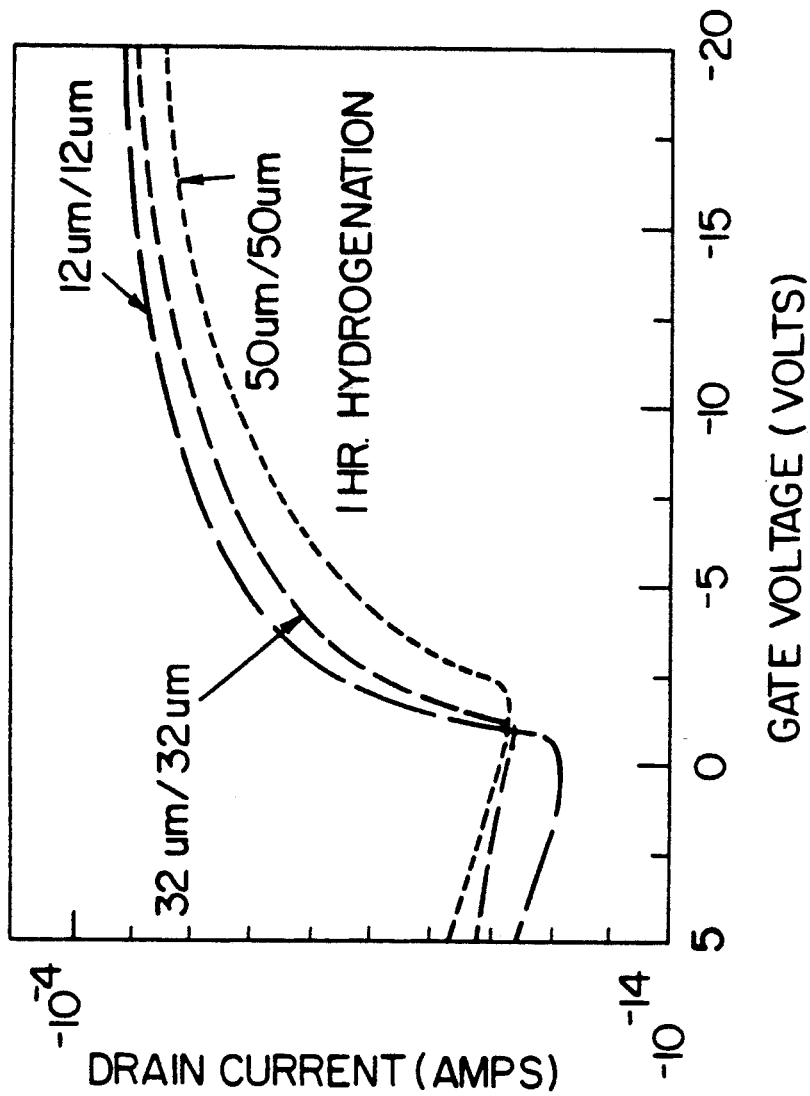
FIG. 15 is a graph of the effect of device size after 1 hour of hydrogenation in a continuous process on the characteristics of TFTs with channel polysilicon thickness of 1000 Å and device sizes of 12 μm/12 μm, 32 μm/32 μm, and 50 μm/50 μm.
Figure 16:
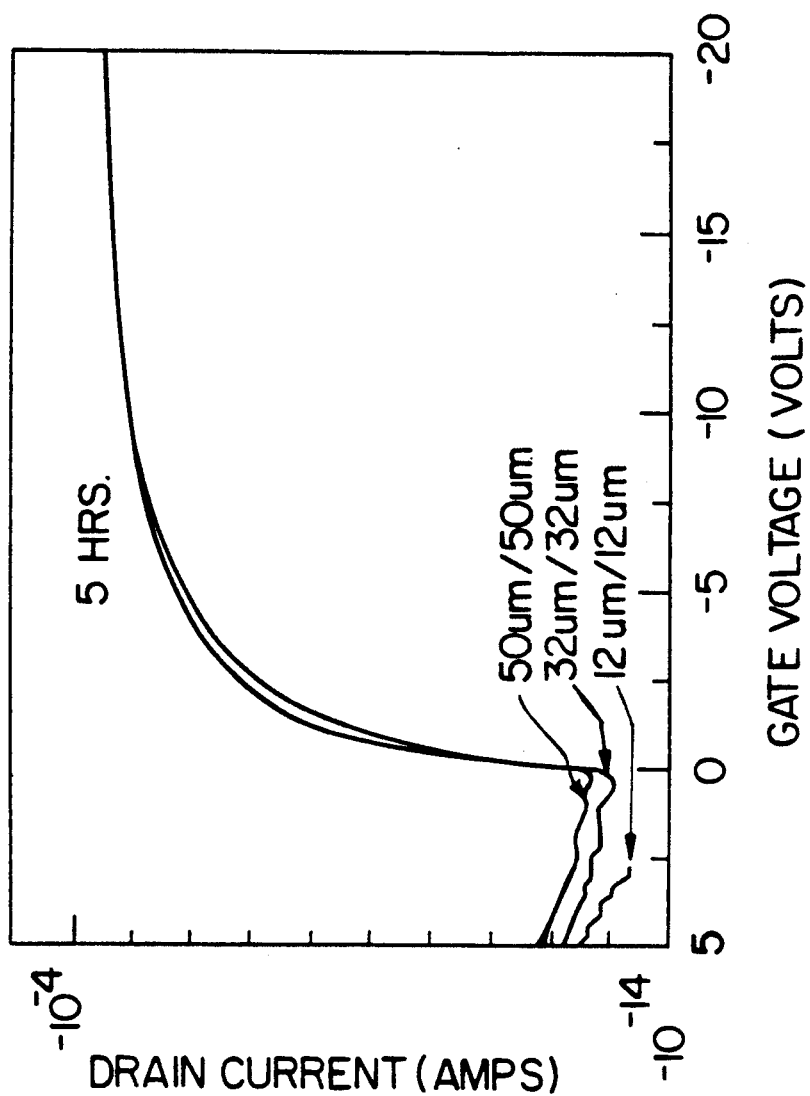
FIG. 16 is a graph of the effect of the device size after 5 hours of hydrogenation in a continuous process on the characteristics of TFTs with channel polysilicon thickness of 1000 Å and device sizes of 12 μm/12 μm, 32 μm/32 μm, and 50 μm/50 μm.

In the preceding experiments, all the experiments were performed with large (32 μm/32 μm) devices. In these experiments, the effect of device dimensions on the degree of hydrogenation and consequent device characteristics is examined. Process parameters were the same as that given for FIG. 12. FIG. 15 compares the device characteristics of TFTs with varying width/channel length (12 μm/12 μm, 32 μm/32 μm and 50 μm/50 μm) which were hydrogenated for 60 minutes. All the TFTs were fabricated with 1000 Å polysilicon. From the figure it can be seen that the smallest device possesses much better characteristics although all three devices have a width to length ratio of one. However, when the devices are hydrogenated for 5 hours (FIG. 16), the TFT characteristics, except leakage current, are almost independent of device dimensions. Leakage current scales with width and is independent of channel length. From FIGS. 15 and 16 it may be concluded that smaller devices hydrogenate faster than larger devices. TFTs fabricated with thinner (500 Å) polysilicon, also show a similar effect, with smaller devices hydrogenating faster than larger ones.

Mechanism of hydrogen transport to the channel polysilicon

Figure 17:
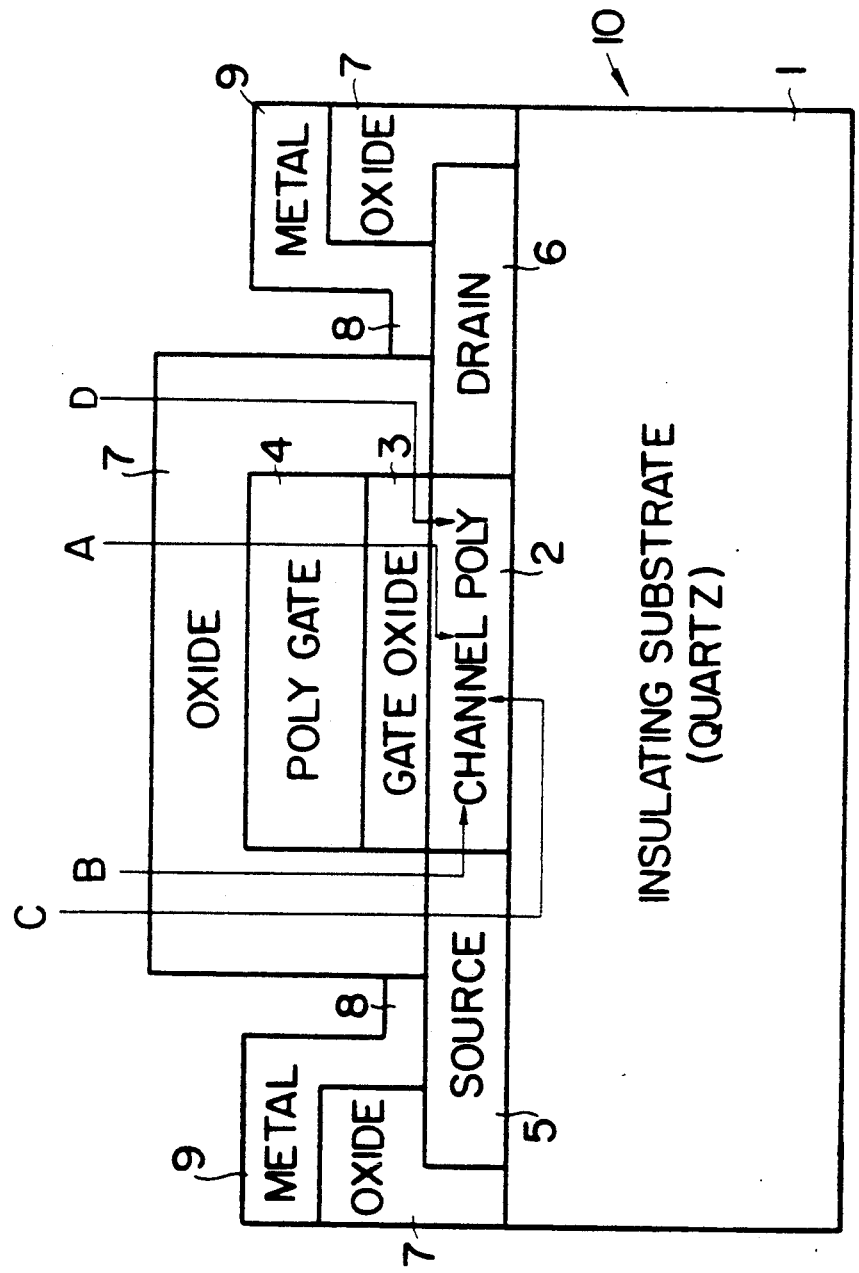
FIG. 17 is an illustration of the possible paths for hydrogen transport to channel polysilicon.

The data presented earlier was examined to trace the mechanism of hydrogen transport to the channel polysilicon. FIG. 17 indicates the possible paths. While not intending to be bound by any theory, it is believed that since smaller devices hydrogenate faster than larger devices, path A (through the polysilicon gate) may be ruled out. A wide range of values has been reported in the literature for the diffusion of atomic hydrogen through single crystal silicon ($10^{-6}$cm$^2$/s to $10^{-12}$cm$^2$/s at 350° C.). See for example, S.J. Pearson et al, "Hydrogen in Crystalline Semiconductor," Appl. Phys. A, Vol. 43, 1987, p. 153. In polycrystalline silicon the diffusivity is expected to be higher; however polysilicon absorbs considerable amounts of hydrogen, so it is not surprising that hydrogen cannot go through the thick polysilicon gate. Thus the hydrogen goes around the polysilicon gate—either through the channel polysilicon (path B) or through the quartz substrate (path C) or through the gate oxide (path D). However, since thinner devices hydrogenate faster than thicker devices, path B may also be eliminated as a possible diffusion path since the area of path B through which the hydrogen can enter is proportional to the polysilicon thickness, which compensates for the increased polysilicon volume (again proportional to thickness) which has to be hydrogenated. In addition since hydrogen cannot go through 0.5 μm polysilicon gate path A), it is unlikely that it will go through several microns of channel polysilicon (path B). Thus it appears that the hydrogen can only follow paths C and/or D. It should be noted that in path C, the hydrogen does not necessarily have to go through the thin polysilicon in the source or drain regions, it can go by the side of the source or drain polysilicon into the quartz. Since the gate oxide and the quartz substrate are essentially the same material (silicon dioxide) the diffusivity of hydrogen should be the same in both. However, the cross sectional area through which the flux of hydrogen atoms may enter the gate oxide is limited by the oxide thickness—only 1000 Å, compared with a length of several microns through which the hydrogen has to diffuse. The quartz substrate, however, is thick in comparison (550 μm), so its thickness should pose no limitation to hydrogen diffusion. Thus path C appears to be the most likely path (or the path of least resistance) for the diffusion of hydrogen.

Figure 18:
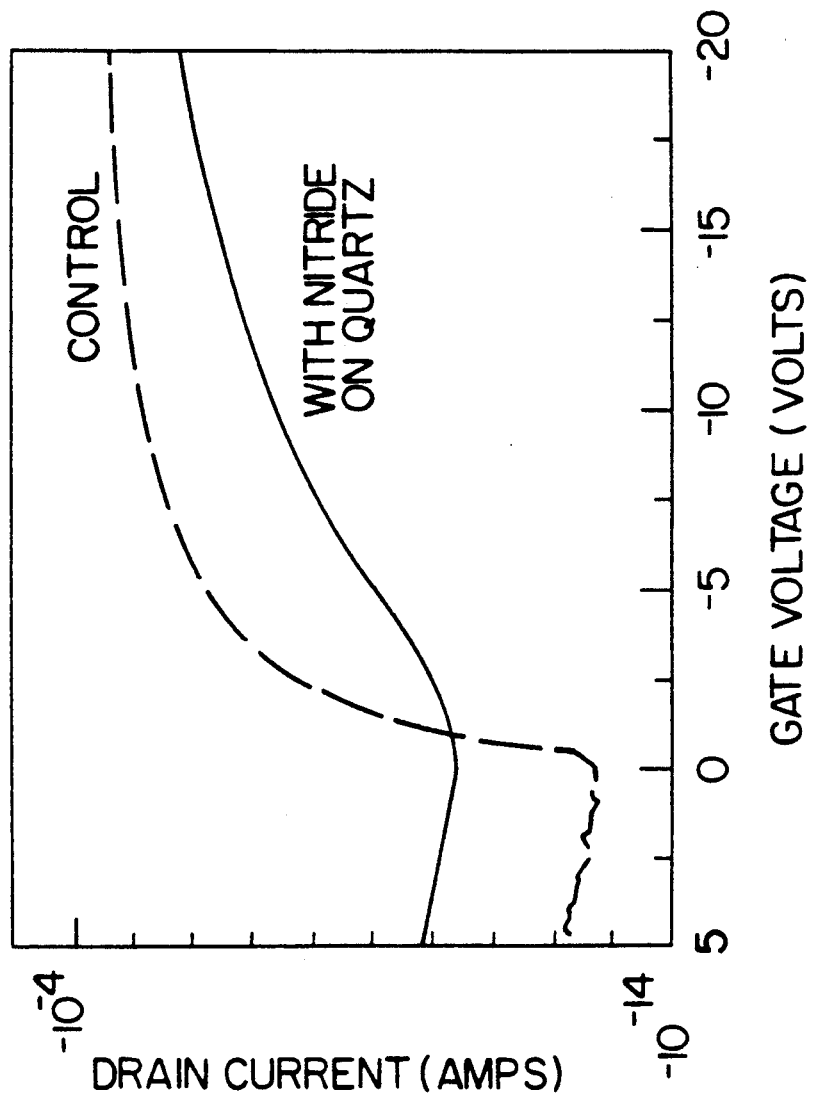
FIG. 18 is a comparison of device characteristics of 32 μm/32 μm TFT fabricated on nitride coated quartz substrate to that fabricated on quartz with no nitride coating. Both TFTs had 1000 Å channel polysilicon.

According to the above hypothesis diffusion of hydrogen atoms through the quartz controls the hydrogenation of the polysilicon. To test this theory, 1000 Å of silicon nitride followed by 2000 Å of LPCVD oxide was deposited on the quartz surface prior to TFT fabrication. Silicon nitride is well known for its properties as a diffusion barrier so it should prevent hydrogen diffusion into the quartz. The 2000 Å of LTO on top of the nitride was used as an etch stop so that the nitride beneath would not be etched during the definition (etch) of the channel polysilicon. The TFT was then hydrogenated along with a control sample (TFT with no nitride layer on top of the quartz). The process conditions were the same as in FIG. 12. FIG. 18 shows the results. It will be seen that the device characteristics of the sample with the nitride layer on top of the quartz shows very little effect of hydrogenation and is considerably poorer than the control sample (no nitride). This confirms our hypothesis that the hydrogen diffusion through quartz is the rate controlling step in the hydrogenation process for polysilicon TFTs on quartz although it is also possible to hydrogenate the devices through the oxide with the metal layer removed.

Figure 19:
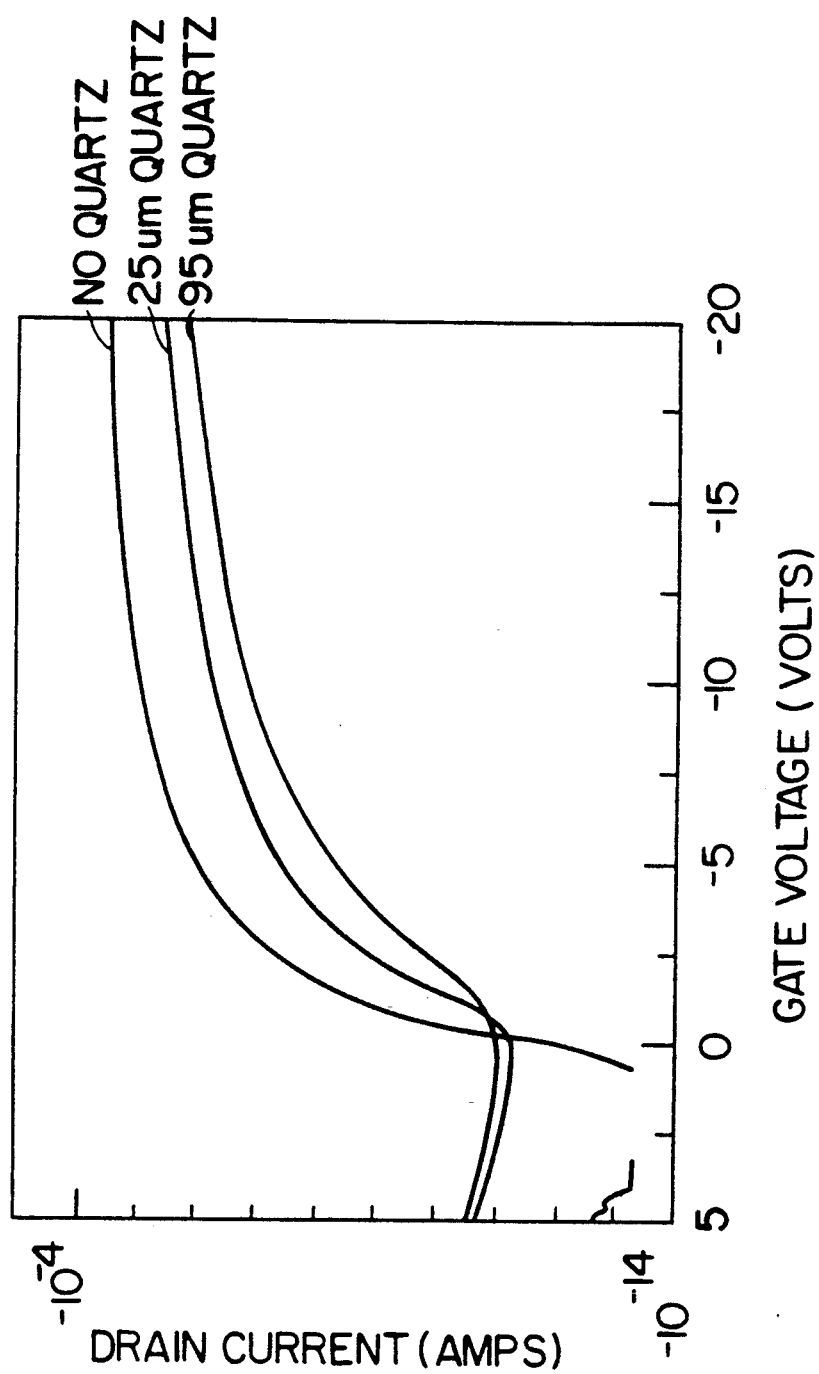
FIG. 19 illustrates results of experiments with quartz layers on top of TFTs.
Figure 20:
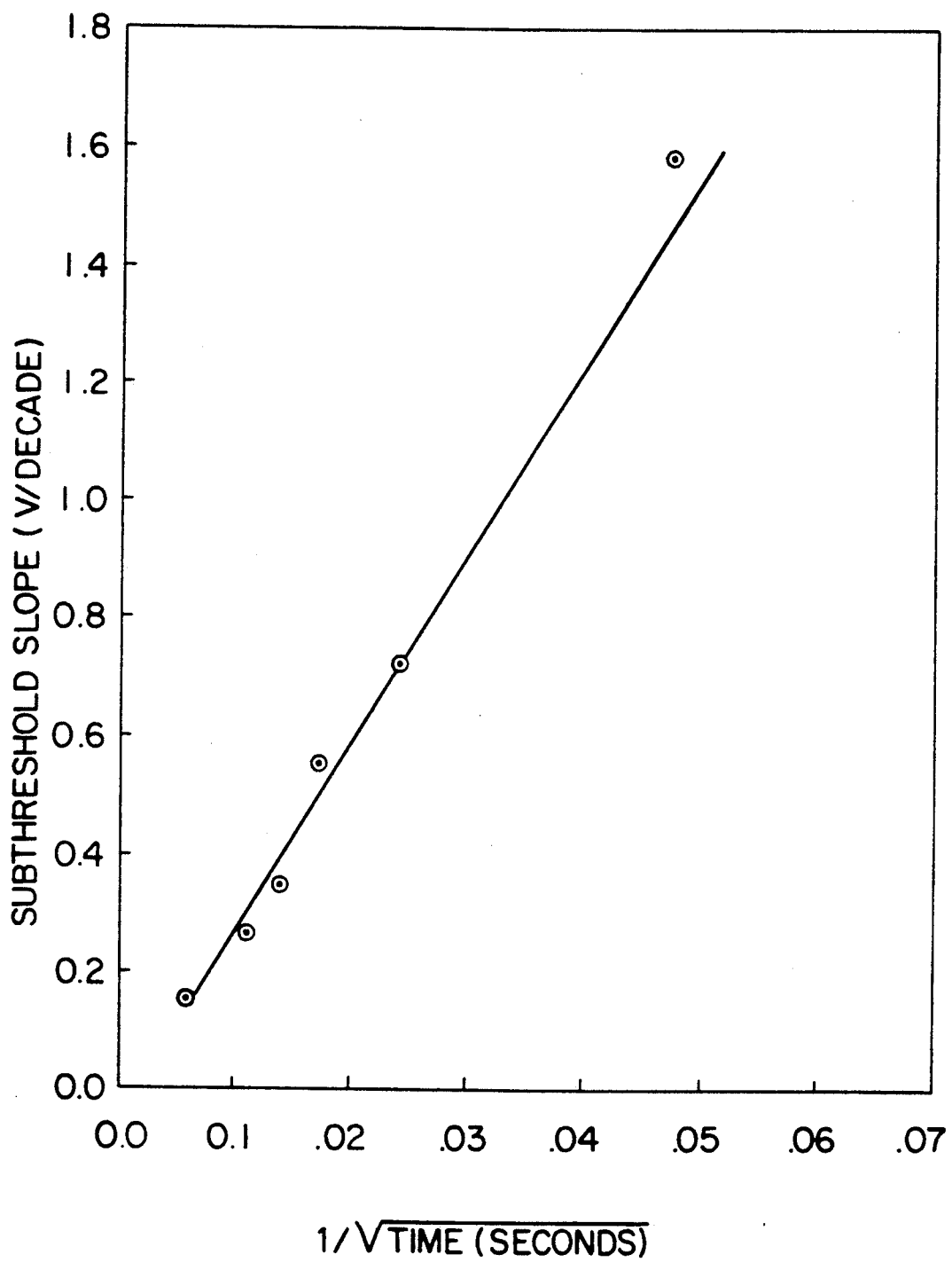
FIG. 20 illustrates the relationship between subthreshold slope and hydrogenation time for 32 μm/32 μm devices, hydrogenated in a one-step process at 275° C. and having thickness of channel polysilicon of 1000 Å.
Figure 21:
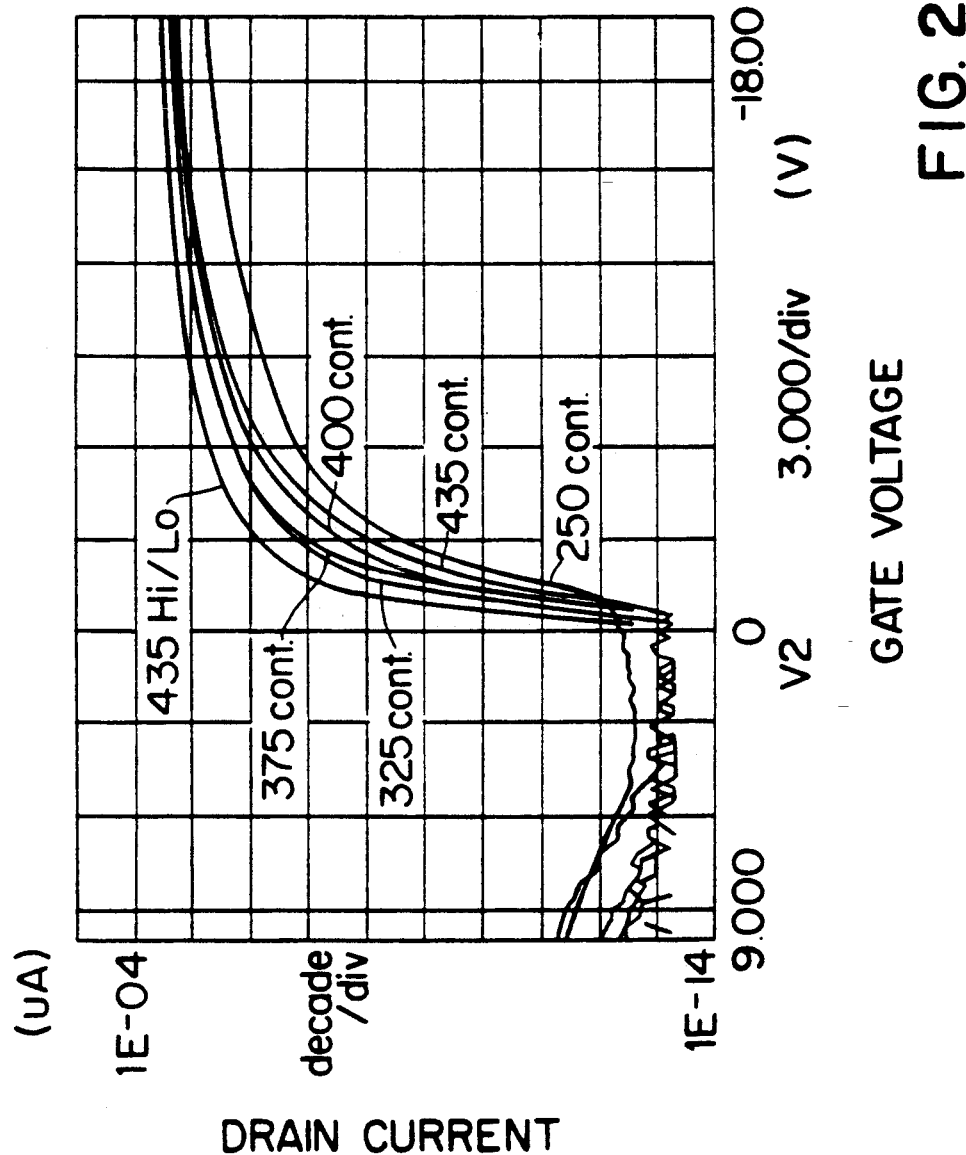
FIG. 21 is a graph of the variation of drain current (in log scale) with Gate Voltage for the 2-step hydrogenation process of the invention (435° C. Hi/Lo, 30 minutes at 435° C. followed by 30 minutes with temperature lowered from 435° C. to 325° C.) vs different single step hydrogenation processes done at different temperatures (250° C., 325° C., 375° C., 400° C., and 435° C.) and in which the total hydrogenation time in all cases was 60 minutes.
Figure 22:
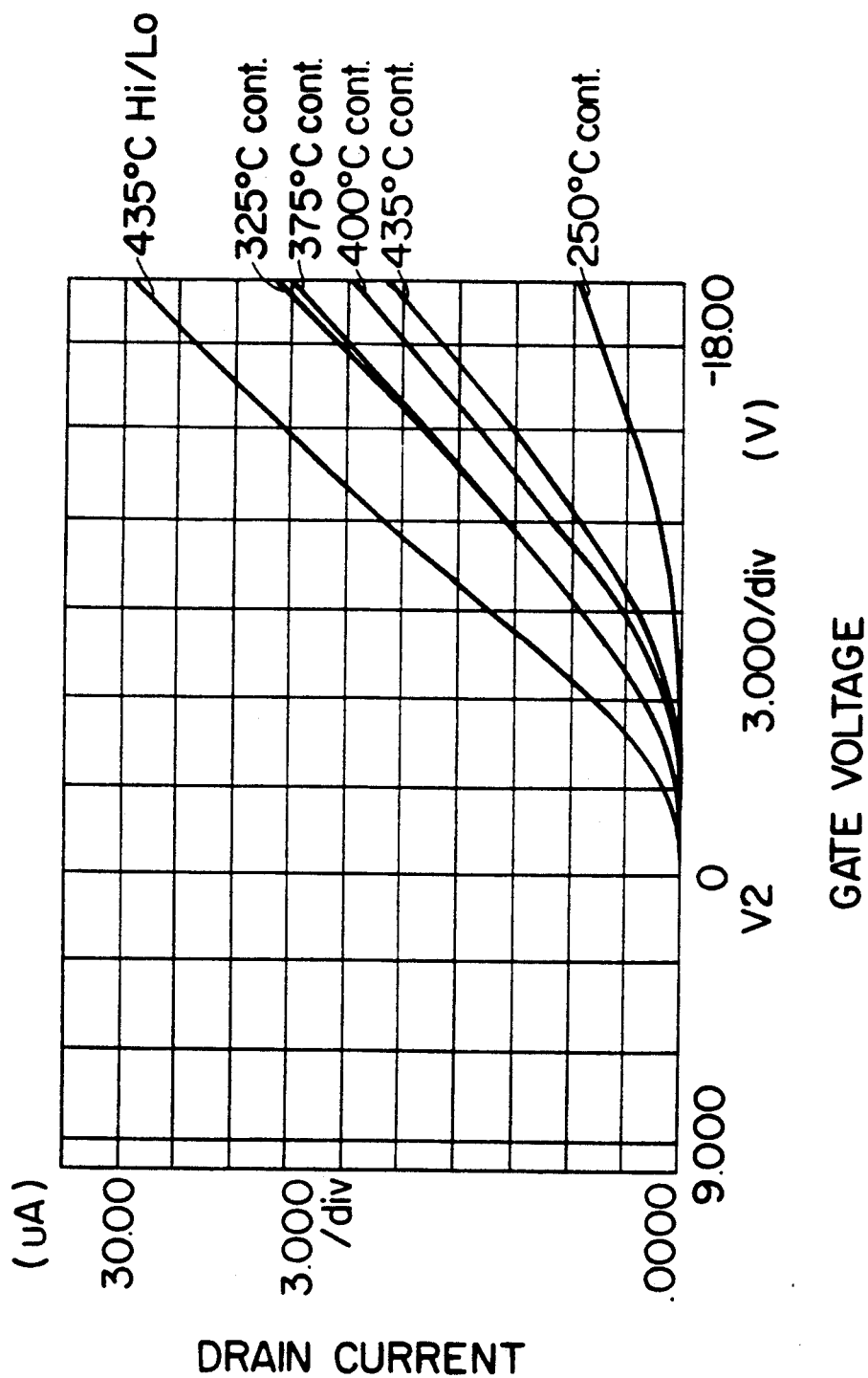
FIG. 22 is the same as FIG. 21 except that the variation in the Drain Current is in linear scale.

Another experiment was performed under the same conditions to verify that hydrogen diffusion through the quartz was the rate controlling step. In this experiment quartz pieces of varying thickness were placed on top of device wafers and then plasma hydrogenation was done using the same process parameters for all pieces. FIG. 19 shows the results. Clearly the extent of hydrogenation depends on the extent the hydrogen has to diffuse through the quartz. Comparison of FIG. 19 with FIG. 15 (effect of device size on hydrogenation) further strengthens the hypothesis.

In other experiments, the standard continuous hydrogenation process was carried out at 325° C., 500 W at 13.56 MHz, 105–110 mTorr and with a flow of 45–50 sccms of hydrogen. It was found that the uniformity of the continuous hydrogenation within a given wafer varied possibly as a result of different gas flow patterns and/or to the non-uniformity of the sputter deposit on the wafer surface generated during hydrogenation. It was found that by rotating the samples 180 degrees at the midpoint of the hydrogenation cycle, the sputter deposit was more even and device characteristics were extremely uniform. Unlike in the continuous processing, Hi/Lo processing according to the invention was found to result in extremely uniform hydrogenated TFTs with or without wafer rotation. Electrical measurements taken on at least 500 transistors were extremely uniform.

Figure 10B:
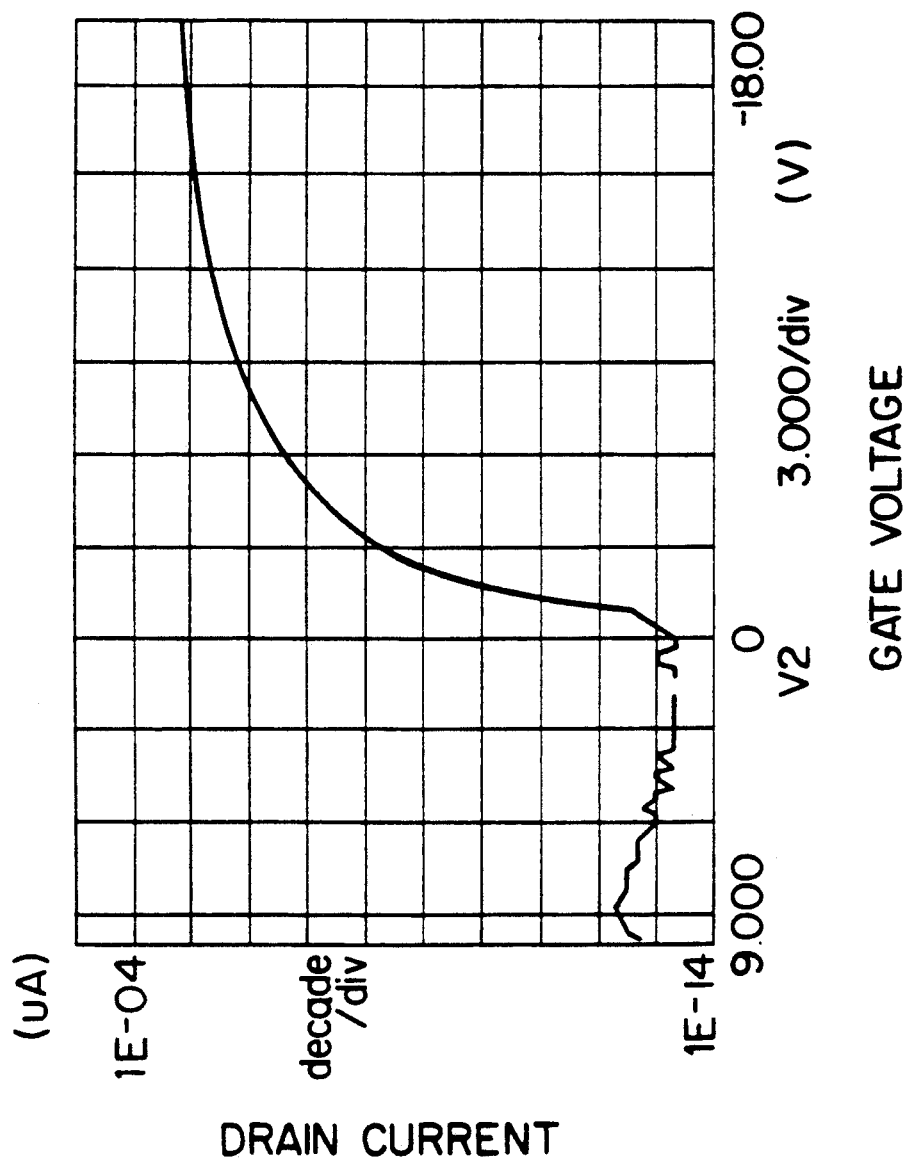
Figure 11:
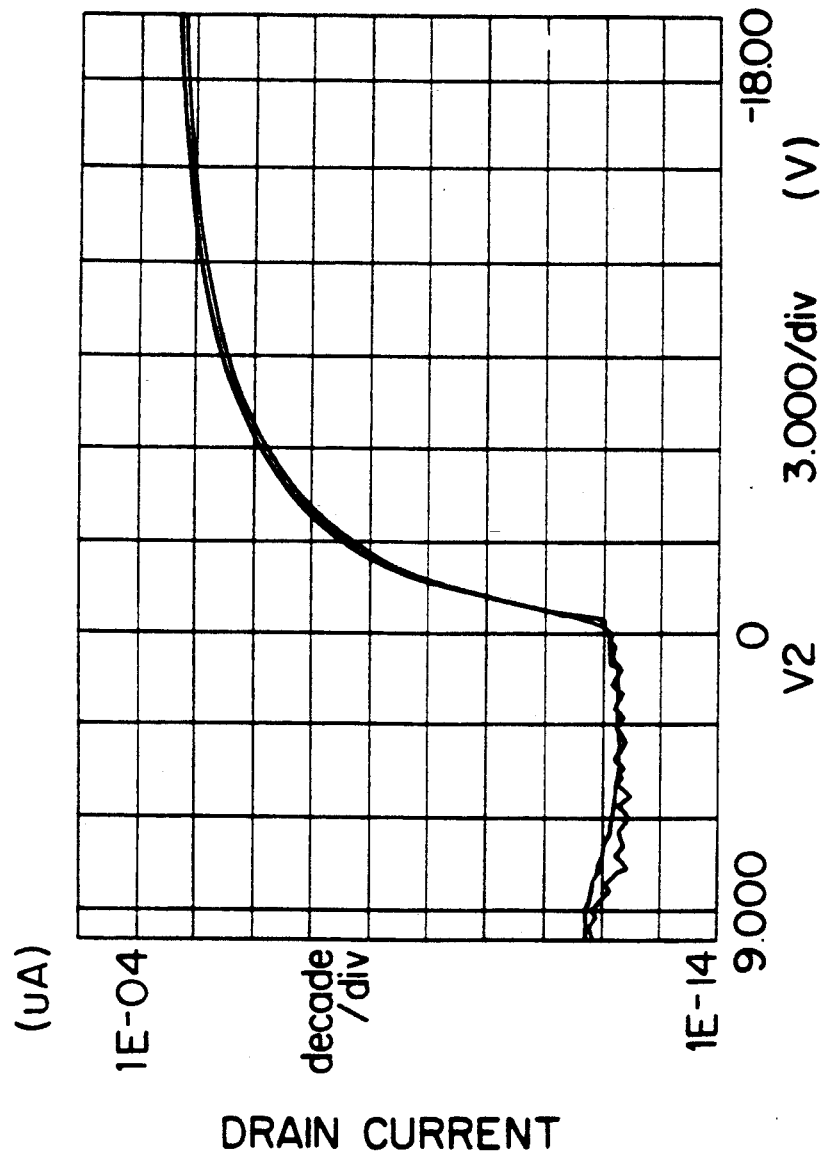
FIG. 11 is a graph showing the drain current versus gate voltage for a device comprising a back light shield and hydrogenated in a one-step continuous process.

In another series of experiments, under the same conditions, TFT arrays with polysilicon back light shielding and/or natural or synthetic quartz substrates normally require hydrogenation times of six to nine hours. According to the invention, however, the processing of such difficult to hydrogenate devices may also be improved. This is shown by the results illustrated in FIGS. 10 and 11 in which such a device with back light shielding is processed with excellent results in 4.5 hours and 6.5 hours (FIGS. 10a and 10b) when using 500 W at 13.56 MHz, 110 in Torr, 45 sccm hydrogen, at 435° C. followed by cooling to 325° C. for 30 minutes.

In contrast thereto, comparable results with the same device hydrogenated with the one-step continuous process required 8 hours. Rapid hydrogenation of the devices with back light shielding, i.e. wherein there is a shield substance between the substrate and the polysilicon which normally prevents diffusion through the substrate requiring the hydrogen to diffuse along a path (analogous to that of a pipe) leading into the polysilicon, is particularly significant and lends great flexibility and adaptability to the process making it suitable for use in a variety of applications.

While specific time periods and temperatures have been enumerated for purposes of illustration, it will be understood that the invention is not limited to these particular time-temperature relationships since it is expected that even more rapid hydrogenation may be obtained at higher temperatures for shorter time periods primarily depending on the plasma generating equipment that is available.

We claim:

1. A method of manufacturing a semiconductor device which comprises the steps of
   (a) providing a semiconductor body capable of undergoing hydrogen in-diffusion and hydrogen out-diffusion at selected temperatures;
   (b) subjecting said semiconductor body to plasma hydrogenation to effect in-diffusion of atomic hydrogen, said in-diffusion being effected at a hydrogenation temperature that is higher than the out-diffusion temperature at which a substantial amount of hydrogen escapes from said semiconductor body; and
   (c) maintaining said hydrogenation plasma while said semiconductor body is cooled to a temperature at which out-diffusion is substantially avoided.

2. A method of manufacturing a semiconductor device which comprises the steps of
   (a) providing a semiconductor body capable of undergoing hydrogen in-diffusion and hydrogen out-diffusion at selected temperatures;
   (b) subjecting said semiconductor body to plasma hydrogenation to effect in-diffusion of atomic hydrogen, said in-diffusion being effected at a hydrogenation temperature that is higher than the out-diffusion temperature at which a substantial amount of hydrogen escapes from said semiconductor body;

(c) maintaining said hydrogenation plasma at said hydrogenation temperature for a period of time sufficient to obtain substantial equilibrium of said hydrogen in-diffusion and out-diffusion relative to said semiconductor body; and (d) maintaining said semiconductor body in contact with said hydrogenation plasma while said semiconductor body is cooled to a temperature at which out-diffusion is substantially avoided.

3. A method of manufacturing a semiconductor device which comprises the steps of (a) providing a semiconductor body capable of undergoing hydrogen in-diffusion and hydrogen out-diffusion at selected temperatures;

(b) subjecting said semiconductor body to a hydrogenation plasma to effect in-diffusion of atomic hydrogen, said in-diffusion being effected at a temperature within the range of about 400° C. to about 800° C.; and (c) maintaining said semiconductor body in contact with said hydrogenation plasma while said semiconductor body is cooled to a temperature within the range of about 25° C. to about 375° C.

4. A method of manufacturing a semiconductor device which comprises the steps of (a) providing a semiconductor body capable of undergoing hydrogen in-diffusion and hydrogen out-diffusion at selected temperatures;

(b) subjecting said semiconductor body to a hydrogenation plasma to effect in-diffusion of atomic hydrogen, said in-diffusion being effected at a temperature of about 435° C. for a period of time not greater than about 30 minutes; and (c) maintaining said semiconductor body in contact with said hydrogenation plasma while said semiconductor body is cooled a temperature of about 325° C. over a period not greater than about 30 minutes.

5. A method as claimed in claim 1 wherein said semiconductor device is a polysilicon liquid crystal display device.

6. A method as claimed in claim 1 wherein said semiconductor device is a polysilicon thin film transistor.

7. A method as claimed in claim 4 in which said semiconductor device is a polysilicon liquid crystal display device.

8. A method as claimed in claim 4 wherein said semiconductor device is a polysilicon thin film transistor.

9. A method as claimed in claim 4 wherein said semiconductor device is a polysilicon MOSFET.

* * * * *